United States Patent [19]

Shiga

[11] Patent Number: 5,444,399

[45] Date of Patent: Aug. 22, 1995

[54] MIXER CIRCUIT

[75] Inventor: Nobuo Shiga, Yokohama, Japan

[73] Assignee: Sumitomo Electric Industries, Ltd., Osaka, Japan

[21] Appl. No.: 109,538

[22] Filed: Aug. 20, 1993

[30] Foreign Application Priority Data

Sep. 11, 1992 [JP] Japan .................. 4-243229

[51] Int. Cl.[6] ............... H03K 3/353; H03B 19/00
[52] U.S. Cl. ................... 327/105; 327/355; 327/356
[58] Field of Search .............. 257/270, 280, 285; 328/14, 15, 104, 160; 307/529, 271; 455/333

[56] References Cited

U.S. PATENT DOCUMENTS

| | | | |
|---|---|---|---|
| 4,048,646 | 9/1977 | Ogawa et al. | 257/15 |
| 4,264,981 | 4/1981 | Vilimek | 455/333 |
| 4,308,473 | 12/1981 | Carnes | 307/529 |
| 4,389,660 | 6/1983 | Decker | 257/270 |
| 4,459,556 | 7/1984 | Nanbu et al. | 257/270 |
| 4,511,813 | 4/1985 | Pan | 257/270 |
| 4,658,440 | 4/1987 | Pavio et al. | 455/333 |
| 4,709,410 | 11/1987 | Tajima et al. | 455/333 |
| 4,751,744 | 6/1988 | Pavio, Jr. | 455/333 |
| 4,783,688 | 11/1988 | Shannon | 257/285 |
| 4,814,649 | 3/1989 | Young | 307/529 |
| 4,814,851 | 3/1989 | Abrokwah et al. | 257/192 |
| 4,841,169 | 6/1989 | Tsironis | 307/529 |
| 5,047,816 | 9/1991 | Cuevas | 257/401 |
| 5,083,050 | 1/1991 | Vasile | 307/259 |
| 5,164,686 | 11/1992 | Shiga | 331/99 |
| 5,196,359 | 3/1993 | Shih et al. | 257/280 |
| 5,263,198 | 11/1993 | Geddes et al. | 455/333 |

FOREIGN PATENT DOCUMENTS

| | | | |
|---|---|---|---|
| 0128907 | 10/1980 | Japan | 455/333 |
| 0090806 | 5/1983 | Japan | 455/333 |
| 0199306 | 9/1986 | Japan | 455/333 |
| 0072210 | 4/1987 | Japan | 455/333 |
| 0288004 | 11/1989 | Japan | 455/333 |

OTHER PUBLICATIONS

Funkschau, vol. 6, No. 21 article entitled "Applikationen für Satelliten-Receiver", by Roland Reuschle and Prof. Harshavadar Shah, published Oct. 1989, pp. 61-65.

Electornique Radio Plans, No. 513 article entitled "Les transistors TEC á l'arséniure de Gallium", published Aug. 1990, pp. 59-68.

Elektor Electronics, No. 158+Suppl. article entitled "GaAs FET Converter For 23 CM Amateur Television", by G. Wehrhan, Jul.-Aug. 1988, pp. 45-49.

IEEE International Microwave Symposium Digest, article entitled "Design And Performance Of Dual-Gate GaAs MESFET Up-Convertor", by A. A. de Salles, May 31, 1983, pp. 440-442.

Primary Examiner—Timothy P. Callahan
Assistant Examiner—T. Lam
Attorney, Agent, or Firm—Beveridge, DeGrandi, Weilacher & Young

[57] ABSTRACT

In a mixer circuit, a first gate 25a of a dual gate MESFET 1 having pulse doped structure is connected through a filter 4 to an LO signal input terminal 5, and a second gate 25b is connected through a matching circuit 6 to an RF signal input terminal 7. The drain 27 of the FET 1 is connected through a low-pass filter 10 to an output terminal 11. The gate bias point of the first gate 25a is set in the vicinity of the pinch-off point of the mutual conductance, and the gate bias point of the second gate 25b is set in the area where the mutual conductance is unvaried with increase of the gate voltage. With this arrangement, the mixer circuit can be so designed that the isolation characteristic of the RF signal and the LO signal is excellent, and a stable operational characteristic can be obtained.

21 Claims, 6 Drawing Sheets

MIXER CIRCUIT

BACKGROUND OF THE INVENTION

1. Field of the Invention

This invention relates to a mixer circuit for use in a converter (frequency converting circuit), a measuring instrument, etc.

2. Related Background Art

Through a recent attempt to rapidly developing an information network system, demand for a satellite communication system has been also rapidly increased, and a frequency band has been shifted to high frequency. In this type of satellite communication system, a down converter for converting a high-frequency signal to a low-frequency signal is required, and a mixer circuit which is applied to the down converter has been also increasingly demanded. There have been conventionally utilized various types of mixer circuits, each of which uses any one of a diode, a bipolar transistor, a FET (field effect transistor), etc. as an active device thereof. An normal MESFET (Metal-semiconductor field effect transistor) or a HEMT (high electron mobility transistor) has been generally used.

It is pointed out as one of most critical problems in design of a mixer circuit using a FET, that is, a FET mixer circuit, that a gate voltage of the FET is greatly fluctuated because an LO (local oscillation) signal is a large-amplitude signal. The variation of the gate voltage induces variation of mutual conductance $g_m$ of the FET, so that a gate/source capacitance $C_{gs}$, and thus input impedance is also varied. That is, viewing from an input side for RF (radio frequency) signals, the FET mixer circuit operates such that the input impedance of the circuit greatly varies as a time function in accordance with fluctuation of the LO signal. Therefore, design of the FET mixer circuit is difficult, and a stable operation thereof is hardly expected.

SUMMARY OF THE INVENTION

An object of this invention is to provide a mixer circuit which is stably operated with no variation of input impedance thereof.

The above and other objects will be more clearly understood from the following description.

According to this invention, it is provided a mixer circuit using a first FET as an active device, in which the first FET comprises a dual gate MESFET having a pulse doped structure and equipped with first and second gates. The first gate of the first FET is connected to a local oscillation signal input terminal. The second gate of the first FET is connected to a radio frequency signal input terminal. A drain of the first FET is connected to an intermediate frequency signal output terminal.

The first FET which is used as an active device in the mixer circuit of this invention comprises the FET having pulse doped structure. This first FET has a special characteristic that "it has a flat area where the mutual conductance is unvaried with a gate voltage", which is not observed for a normal MESFET or HEMT obtained by forming an active layer using an ion injection method. Accordingly, if a bias point for the second gate of the first FET is set in this area, no variation of input impedance occurs due to the RF signal itself.

Further, if the gate bias voltage of the first gate of the first FET is set to a value in the neighborhood of the pinch-off voltage of the mutual conductance, the frequency conversion could be performed at high conversion efficiency using non-linearity of the mutual conductance.

Still further, the first FET is of a dual gate type, and thus an RF signal and an LO signal are input to different gates respectively, so that an excellent isolation characteristic is obtained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Preferred embodiments according to this invention will be described hereunder with reference to the accompanying drawings.

Figure 1:
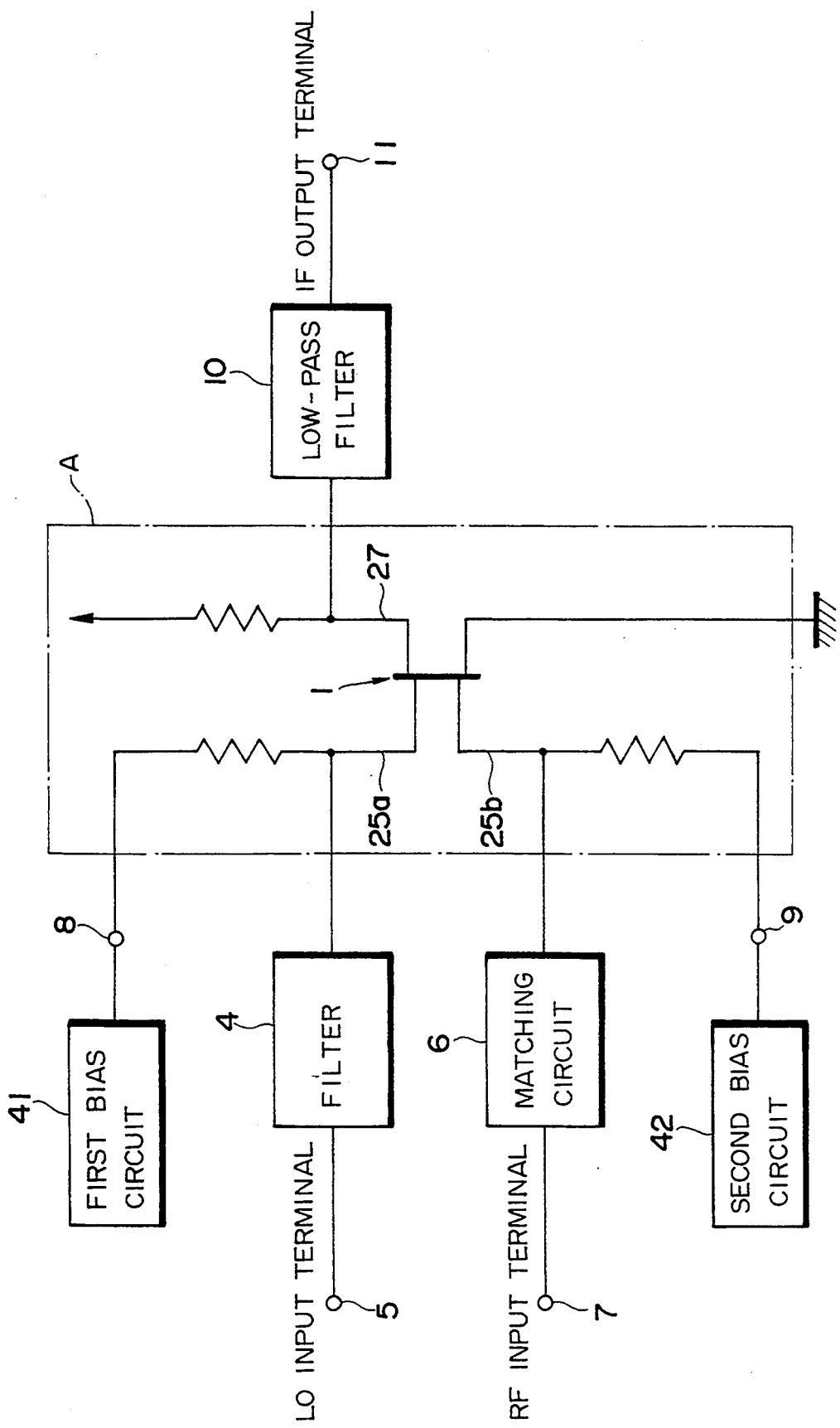
FIG. 1 is a block diagram showing an embodiment of a mixer circuit according to this invention.

FIG. 1 is a block diagram showing an embodiment of a mixer circuit according to this invention. In this mixer circuit, a dual gate MESFET (first FET) 1 having pulse doped structure is used as an active device A for the mixer circuit.

Figure 2:
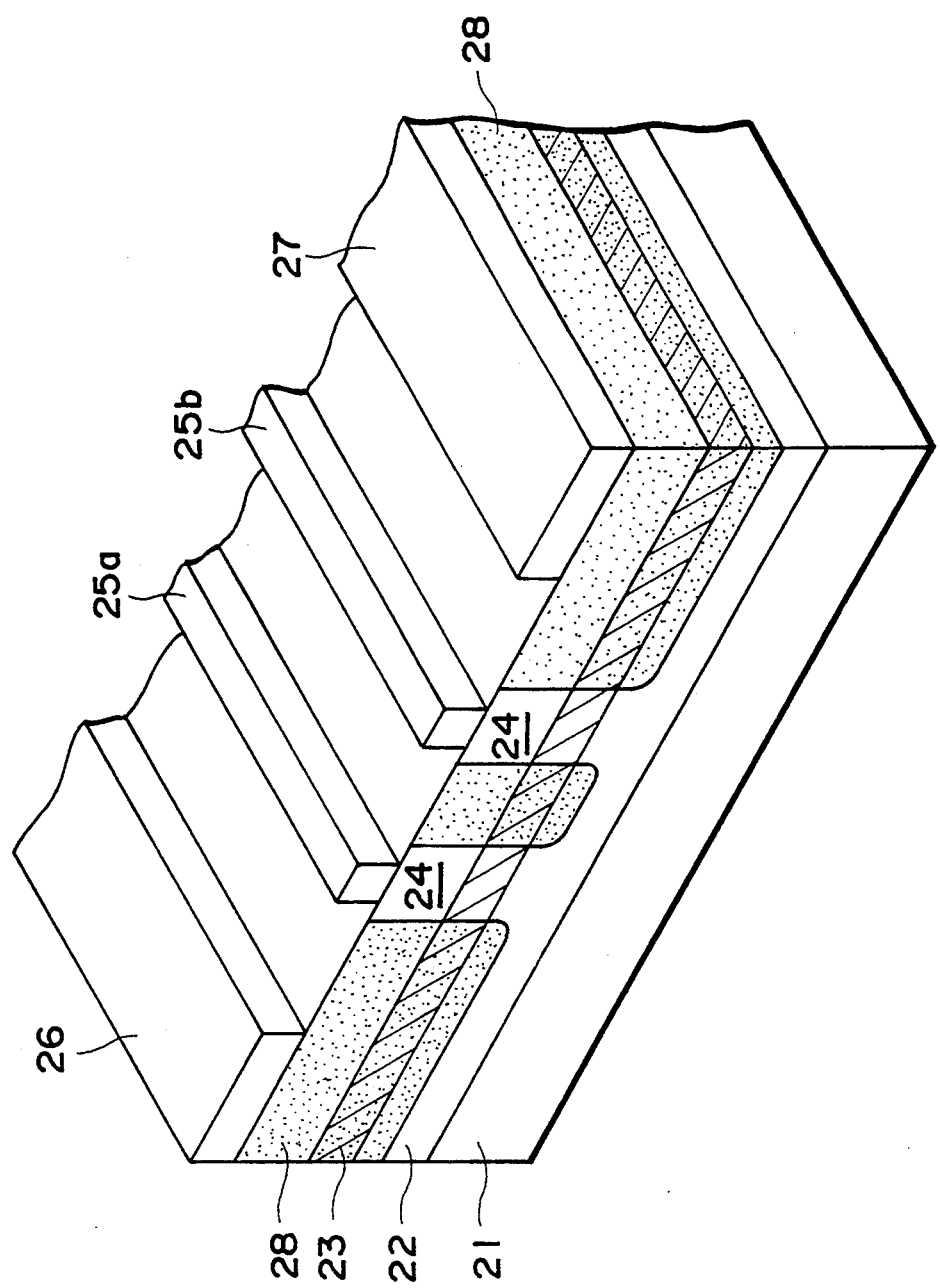
FIG. 2 is a cross-sectional view showing the construction of a dual gate GaAs-MESFET having a pulse doped structure.

FIG. 2 shows the construction of a GaAs-MESFET 1 having pulse doped structure. A $P^-$-GaAs buffer layer 22 doped with no impurity, a pulse doped GaAs layer 23 doped with Si which serves as an active layer, and an $n^+$-GaAs cap layer 24 are laminated in this order on a semi-insulating GaAs substrate 21 by an epitaxial growth method. A source 26 and a drain 27 which are ohmic-contacted with the cap layer 24 are formed on a source region and a drain region on the cap layer 24 respectively, and a pair of first and second gates 25a, 25b which form Shottky-junction in contact with the cap layer 24 are formed in a region between the source region and the drain region. An $n^+$ ion-injection region 28 is formed in each of the areas where the source 26 and the drain 27 are formed and the area between the gates 25a and 25b such that the $n^+$ ion injection regions 28 extend from the surfaces of these areas to the upper portion of the buffer layer 22. The gate length is set to 0.5 μm and the gate width is set to about 300 μm.

The thickness of each layer is set to the following value for example. The thickness of the buffer layer 22 is set to 10000 Å, the thickness of the pulse doped layer 23 is set to 100 Å, the thickness of the cap layer 24 is set to 300 Å, and the impurity density of the pulse doped layer 23 is set to $4.0 \times 10^{18}$ cm$^{-3}$. An organic metal vapor phase epitaxial growth method (OMVPE method) is used as the epitaxial growth method. Specifically, a Cr-doped GaAs substrate is used as a substrate, and both of TMG (trimethyl garium) and AsH$_3$ as source gas and SiH$_6$ as dopant gas are introduced at 60 torr pressure and below 650° C. to perform the vapor phase epitaxial growth. At this time, a source gas introduction V/III ratio is 6 (for buffer layer 22):40 ( for pulse doped layer 23):100 ( cap layer 24).

The first gate 25a of the FET 1 thus formed is connected through a filter 4 to an input terminal 5 for local oscillation (LO) signals. The filter 4 serves to prevent an IF signal generated in the mixer circuit from leaking to the local oscillation circuit side which is connected to the input terminal 5. The second gate 25b of the FET 1 is connected to an input terminal 7 for RF (radio frequency) signals through a matching circuit 6 for performing the matching of input impedance. With this arrangement, the RF signal input through the input terminal 7 is composited with the LO signal input through the input terminal 5, and converted to an intermediate-frequency signal. The drain 27 of the FET 1 is connected to an output terminal 11 through a low-pass filter 10 for passing therethrough only the IF (intermediate frequency) signal which is an output signal. With this arrangement, the IF signal obtained by mixing down the RF signal is output from the output terminal 11.

Terminals 8 and 9 serves as input terminals for supplying a direct-current gate bias voltage to the gates 25a and 25b of the FET 1, respectively. The input terminal 8 is connected to a first bias circuit 41 for supplying the first gate of the first FET 1 with a gate bias voltage in the neighborhood of the pinch-off voltage of the first gate of the first FET 1. The input terminal 9 is connected to a second bias circuit 42 for supplying the second gate 25b of the first FET 1 with such a gate bias voltage that the mutual conductance of the second gate 25b of the first FET 1 is set to a fixed value even when the gate input voltage of the second gate 25b is varied.

Here, significance of the bias voltage values which are supplied by the first and second bias circuits 41 and 42 will be described.

Like the conventional FET mixer circuit, the frequency conversion in the mixer circuit of this invention is carried out using non-linearity of mutual conductance. Accordingly, the first gate 25a to which the LO signal is input is required to be operated at a gate bias point where the mutual conductance $g_m$ behaves non-linearly with variation of the gate voltage $v_g$. On the other hand, the second gate 25b, which is supplied with the RF signal and for which stable input impedance is required, is necessary to be operated at a gate bias point where the mutual conductance $g_m$ is unvaried with respect to the gate voltage $v_g$.

Figure 3:
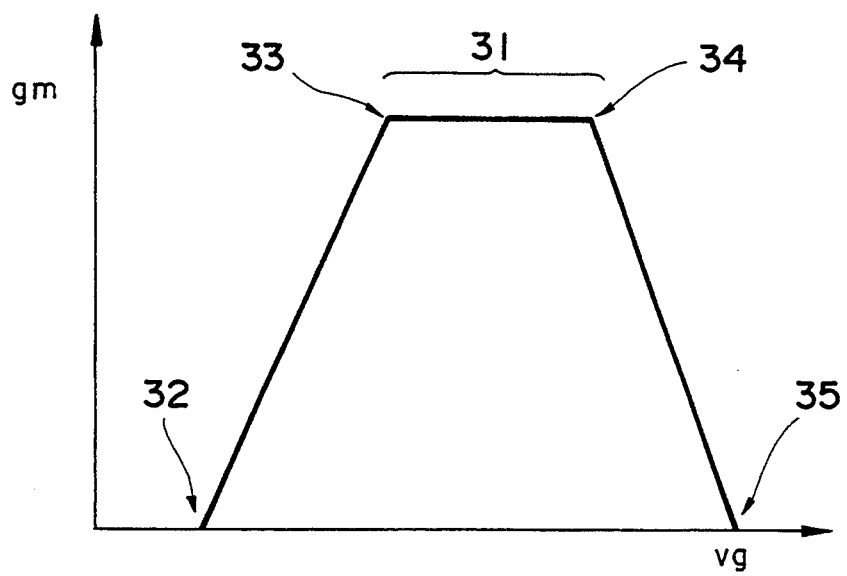
FIG. 3 is a graph showing a gate voltage $V_g$—mutual conductance g, characteristic of the pulse doped structure GaAs-MESFET.

FIG. 3 is a graph showing the characteristic of gate voltage $v_g$—mutual conductance $g_m$ of each gate. Those portions which are in the vicinity of four points as indicated by reference numerals 32 to 35 in FIG. 3 are considered as a gate bias point where the mutual conductance $g_m$ behaves non-linearly with variation of the gate voltage $v_g$. That is, large conversion efficiency can be obtained at the portions in the neighborhood of these points. On the other hand, a flat area 31 may be selected as a gate bias point where the input impedance is not greatly varied with fluctuation of the gate voltage. The flat area 31 where the mutual conductance $g_m$ is unvaried with variation of the gate voltage $v_g$ is an inherent characteristic to the GaAs-MESFET having pulse doped structure, and a conventional device has not have such a characteristic. Non-variation of the mutual conductance $g_m$ means non-variation of input capacitance, that is, the gate/source capacitance Cgs (capacitance between the gate and the source), and the input impedance of each gate of the FET 1 is remarkably dependent on the gate/source capacitance Cgs of each gate. Accordingly, no great variation occurs in the input impedance insofar as the gate voltage $v_g$ is varied in the flat area 31. The impedance is approximately represented by the following equation, and it is also apparent from this equation that the input impedance is greatly dependent on the gate/source capacitance Cgs.

$$Z_{in} = R_g + 1/jwC_{gs} + R_{in} + R_s$$

Here, $R_g$ represents gate resistance; $R_{in}$, channel resistance; and $R_s$, source resistance.

From the above consideration, the gate bias point for the first gate 25a supplied with the LO signal is set to any one of the portions in the vicinity of the four points as indicated by reference numerals 32 to 35. In order to minimize power consumption, it is preferable to set the vicinity of the point 32, that is, the pinch-off point. Further, it is preferable that the flat area 31 where the input impedance is stabilized with variation of the gate voltage is set to the gate bias point for the second gate 25b which is input with the RF signal and for which stable input impedance is required. Like the first gate 25a, the low power consumption is also required for the second gate 25b, and in consideration of this point, the bias point is preferably set to the portion in the vicinity of the point having the lowest gate voltage in the flat area 31, that is, the point 33 in FIG. 3.

Figure 5:
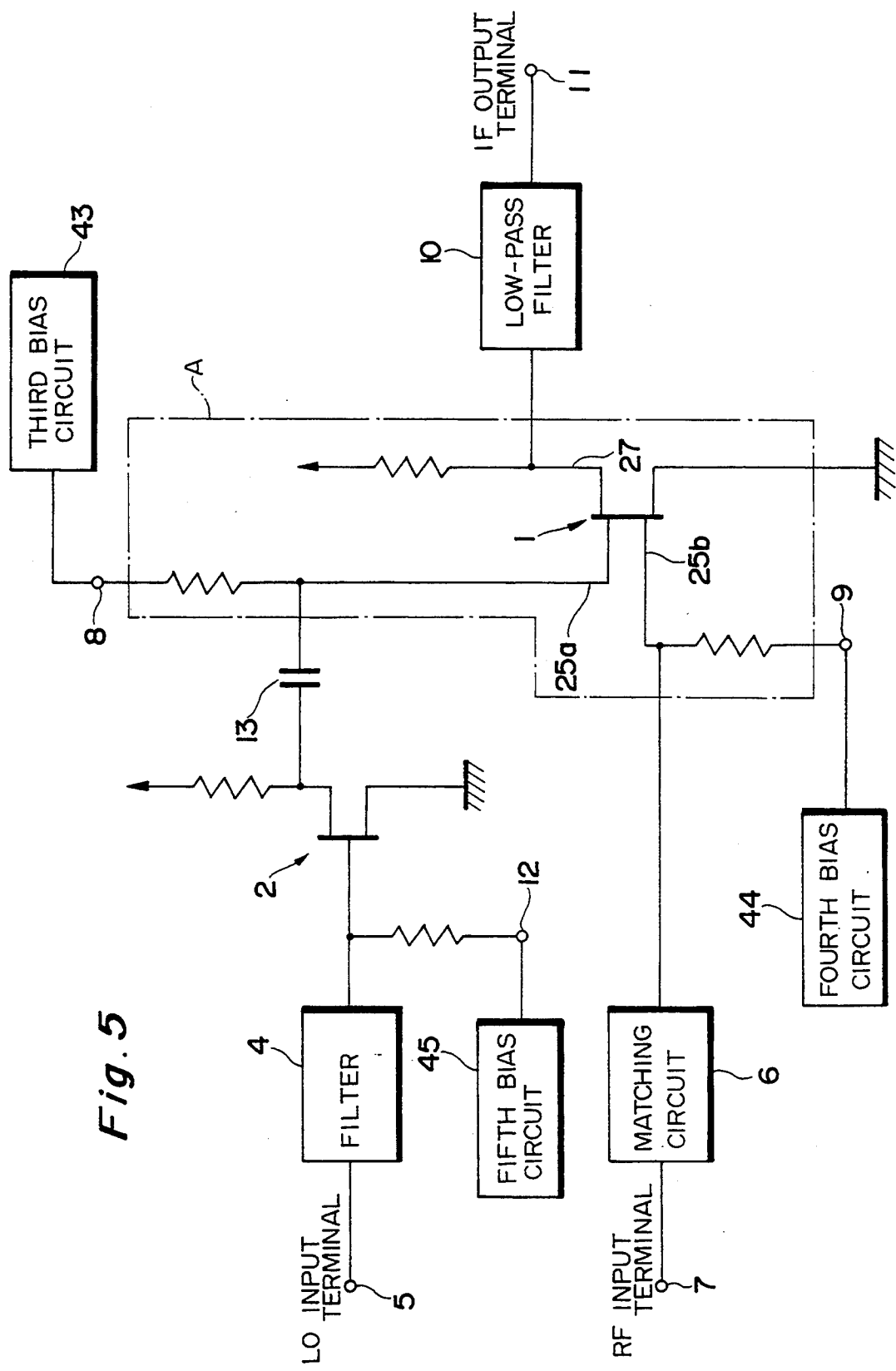
FIG. 5 is a block diagram showing another embodiment of the mixer circuit.

FIG. 5 shows another embodiment of the mixer circuit.

The mixer circuit is so designed that a GaAs-MESFET 2 having pulse doped structure is provided as a second FET between the filter 4 and the first gate 25a of the mixer circuit as shown in FIG. 1. The gate of the FET 2 is connected to an input terminal 5 for an LO signal through the filter 4, and a drain of the FET 2 is connected to the first gate 25a of the FET 1 through a coupling capacitor 13. With this arrangement, alternating current components of a signal output from the drain of the FET 2 are input to the first gate 25a of the FET 1. The gate of the FET 2 is connected to an input terminal 12 for supplying a proper DC gate bias voltage. The input terminal 12 is connected to a fifth bias circuit 45 for supplying such a gate bias voltage that the mutual conductance is unvaried even when the gate input voltage is varied for the gate of the FET 2. The input terminals 8 and 9 of the FET 1 of the mixer circuit are connected to a third bias circuit 43 and a fourth bias circuit, respectively. The third bias circuit 43 supplies the first gate 25a of the FET 1 with a gate bias voltage which is in the vicinity of the pinch-off voltage of the first gate 25a, and the fourth bias circuit 44 supplies the second gate 25b of the FET 1 with such a bias voltage that the mutual conductance of the second gate 25b is unvaried even when the gate input voltage of the second gate 25b is varied.

Figure 4:
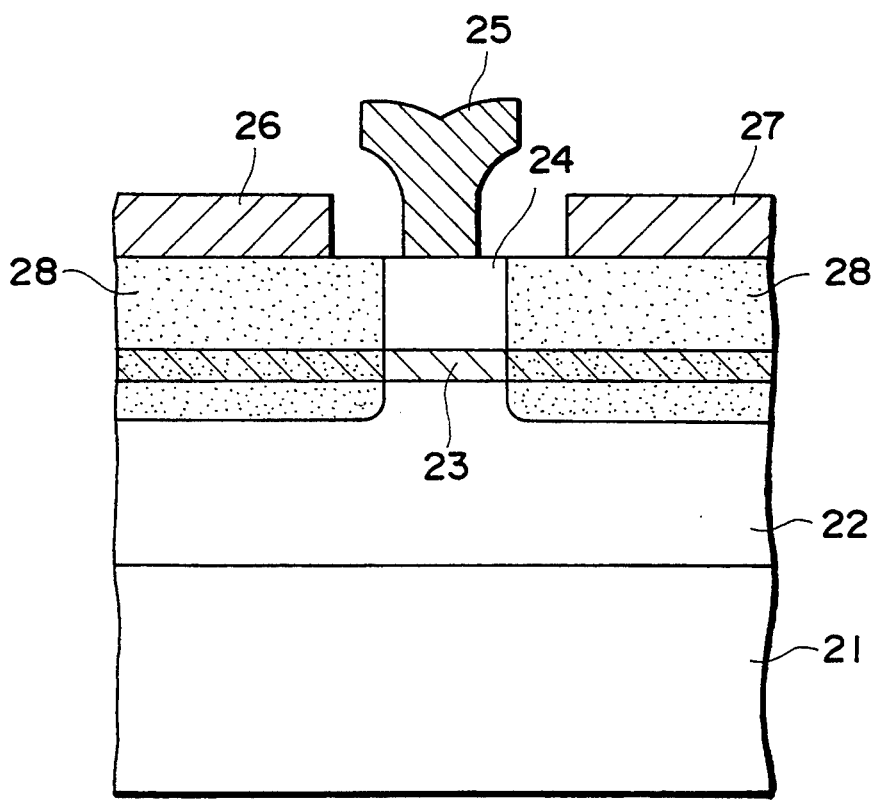
FIG. 4 is a cross-sectional view showing the construction of GaAs-MESFET of pulse doped structure.

In the mixer circuit thus constructed, the FET 2 has a gate 25 as shown in FIG. 4, and the gate width thereof is designed in about 50 to 100 μm, which is shorter than that of the FET 1. As described above, the LO signal is input to the FET 2 having short gate width, and thus the power consumption can be more reduced in comparison with the mixer circuit as shown in FIG. 1. By setting the gate bias point of the FET 2 to the flat area 31 (see FIG. 3) where the input impedance is stabilized with variation of the gate voltage, degree of freedom in bias is increased, and the bias providing the maximum conversion efficiency can be selected.

Figure 6:
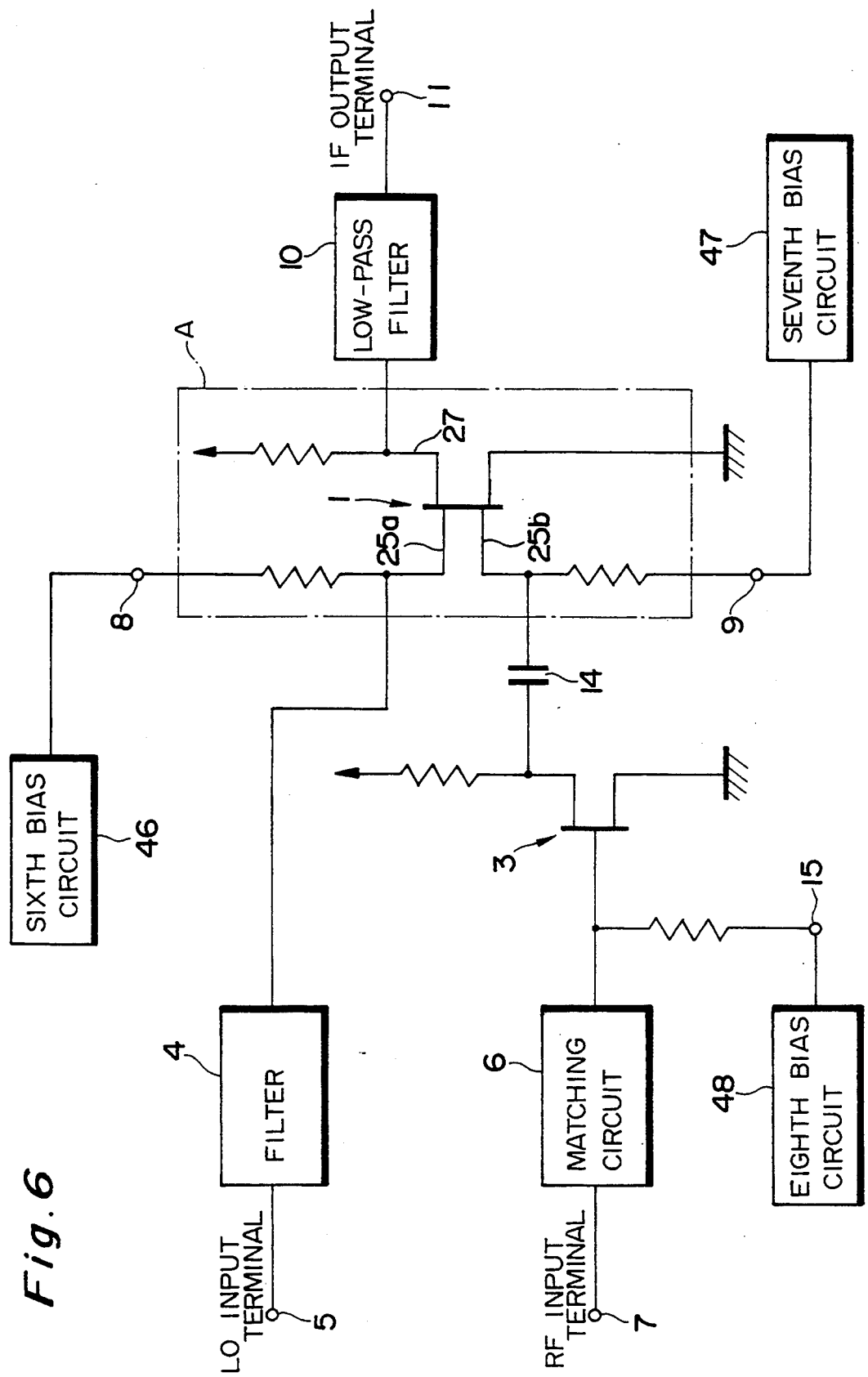
FIG. 6 is a block diagram showing another embodiment of the mixer circuit.

FIG. 6 shows another embodiment of the mixer circuit. The mixer circuit is so designed that a GaAs-MESFET 3 having pulse doped structure is provided between the matching circuit 6 and the second gate 25b of the mixer circuit as shown in FIG. 1. The gate of the FET 3 is connected to the input terminal 7 for the RF signal through the matching circuit 6, and a drain of the FET 3 is connected to the second gate 25b of the FET 1 through the coupling capacitor 14. With this arrangement, alternating current components of a signal output from the drain of the FET 3 are input to the second gate 25b of the FET 1. The gate of the FET 3 is connected to the input terminal 15 for supplying a proper DC gate bias voltage. The input terminal 15 is connected to an eighth bias circuit 48 for supplying a predetermined gate bias voltage to the gate of the FET 3. The input terminals 8 and 9 of the FET 1 of the mixer circuit are connected to a sixth bias circuit 46 and a seventh bias circuit 47 respectively, which supply the first and second gates 25a and 25b of the FET 1 with gate bias voltages in the vicinity of the their pinch-off voltages respectively.

In the mixer circuit thus constructed, the FET 3 has a gate 25 as shown in FIG. 4, and the gate width thereof is designed in about 50 to 100 μm, which is shorter than that of the FET 1. As described above, the RF signal is input to the FET 3 having short gate width, and thus the power consumption can be more reduced in comparison with the mixer circuit as shown in FIG. 1. The gate bias point of the FET 3 is preferably set to the flat area 31 (see FIG. 3) where the input impedance is stabilized with variation of the gate voltage by the eighth bias circuit 48. By setting the gate bias point of the FET 3 to the flat area 31 as described above, the degree of freedom in bias is increased, and the bias providing the maximum conversion efficiency can be selected.

Figure 7:
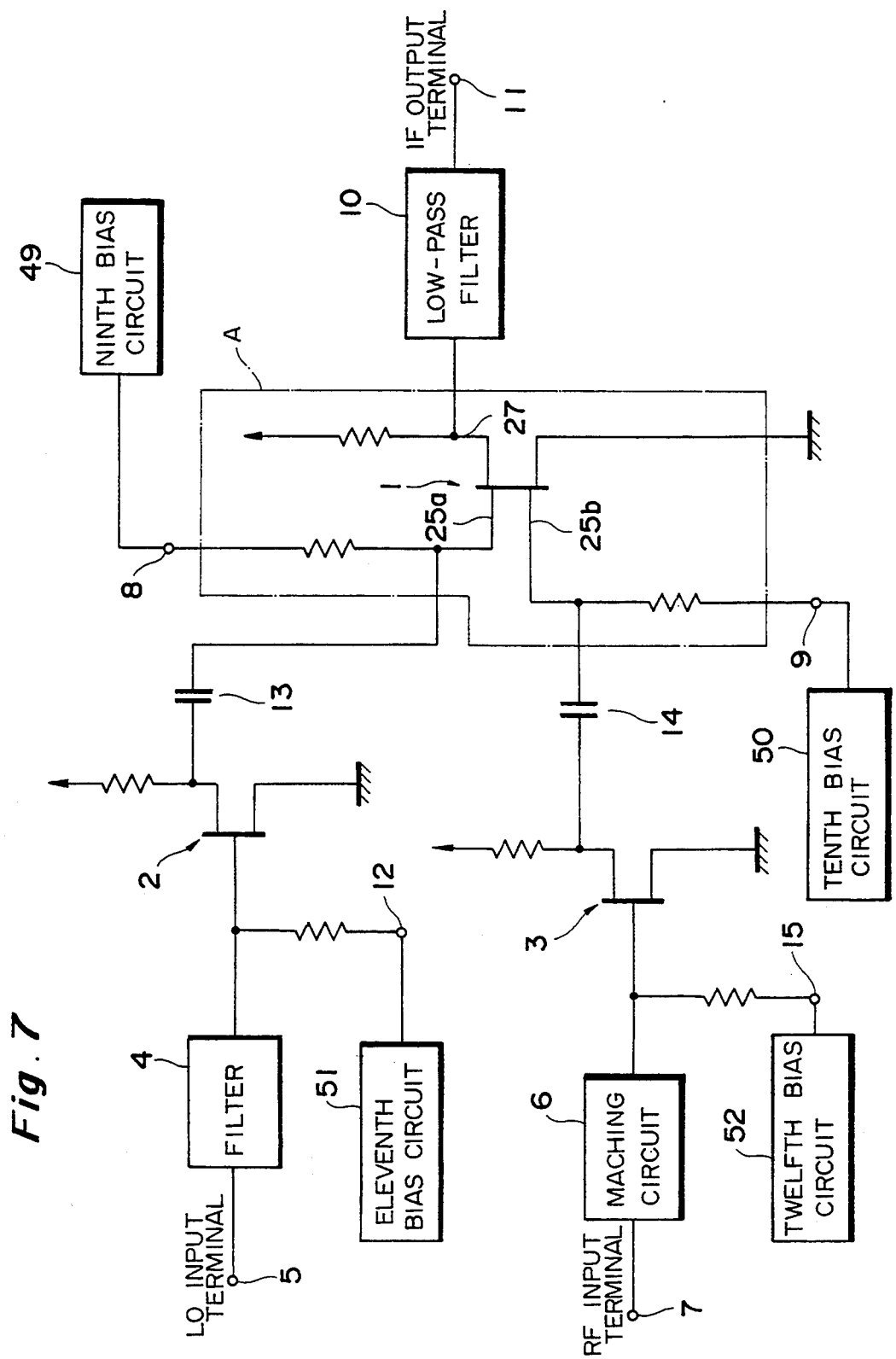
FIG. 7 is a block diagram showing another embodiment of the mixer circuit.

FIG. 7 shows another embodiment of the mixer circuit. This mixer circuit has the FET 2 and the FET 3 in addition to the mixer circuit as shown in FIG. 1. In this case, the input terminals 8 and 9 which are connected to the gates 25a and 25b of the FET 1 respectively are also connected to a ninth bias circuit 49 and a tenth bias circuit 50 respectively, and supply the respective gates 25a and 25b with gate bias voltages in the vicinity of the pinch-off voltages thereof, respectively. The input terminals 12 and 15 which are connected to the gates of the FET 2 and the FET 3 are connected to an eleventh bias circuit 51 and a twelfth bias circuit 52 respectively, and supply the corresponding gates with such gate bias voltages that the mutual conductance of each of the gates is unvaried even when the gate input voltage thereof is varied. (see FIG. 3).

With this circuit construction, the power consumption can be more reduced in comparison with the mixer circuit as shown in FIG. 1. In addition, the degree of freedom in bias is increased, and the bias providing the maximum conversion efficiency can be selected.

As described above, in the mixer circuit as exemplified in the above embodiments, as the active device is used the dual gate MESFET 1 of pulse doped structure which has the first gate 25a and the second gate 25b. In the case where the gate bias point of the first gate 25a is set in the neighborhood of the pinch-off of the mutual conductance and the gate bias point of the second gate 25b is set in the area where the mutual conductance is unvaried with the increase of the gate voltage, there can be obtained the mixer circuit in which the isolation characteristic of the RF signal and the LO signal is excellent and the stable operational characteristic having little variation of the input impedance can be obtained.

Further, in the case where the pulse doped structure MESFETs 2 and 3 having shorter gate width than the FET 1 are provided between the LO signal input terminals 5 and the first gate 25a and/or between the RF signal input terminal 7 and the second gate 25b, the input current to the FET 1 can be suppressed, so that the power consumption can be reduced. In addition, the gate bias point of the gate of the FET 2,3 is set in the area where the mutual conductance is unvaried with the increase of the gate voltage, so that the degree of freedom of the bias is increased and the bias providing the maximum conversion efficiency can be selected.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A mixer circuit for mixing a radio frequency signal and a local oscillation signal to output an intermediate frequency signal comprising:

a radio frequency signal input terminal to be supplied with the radio frequency signal, a local oscillation signal input terminal to be supplied with the local oscillation signal, an intermediate frequency signal output terminal for outputting the intermediate frequency signal, a first field effect transistor with a pulse-doped structure, for mixing the radio frequency signal and the local oscillation signal from said input terminals to output the intermediate frequency signal, said first field effect transistor being a dual gate field effect transistor and having
      a first gate,
      a second gate connected to said radio frequency input terminal,
      a drain connected to said intermediate frequency signal output terminal, and
      a source connected to a voltage potential, and
      second field effect transistor with pulse-doped structure, said second field effect transistor being a single gate field effect transistor and having
      a gate connected to said local oscillation signal input terminal, said gate of said second field effect transistor having a shorter gate width than said first gate of said first field effect transistor, a drain connected to said first gate of said first field effect transistor, and a source connected to said voltage potential.

2. The mixer circuit as claimed in claim 1, wherein said mixer includes:

first bias means for supplying said first gate of said first field effect transistor with a gate bias voltage in the vicinity of a pinch-off voltage of said first gate;

second bias means for supplying said second gate of said first field effect transistor with a gate bias voltage such that a mutual conductance of said second gate is unvaried even when a gate input voltage of said second gate is varied; and third bias means for supplying said gate of said second field effect transistor with a gate bias voltage such that a mutual conductance of said gate of said second field effect transistor is unvaried even when a gate input voltage of said gate of said second field effect transistor is varied.

3. The mixer circuit as claimed in claim 2, wherein said second field effect transistor is a GaAs-MESFET having a pulse-doped structure.

4. The mixer circuit as claimed in claim 3, further including a coupling capacitor disposed between said drain of said second field effect transistor and said first gate of said first field effect transistor.

5. The mixer circuit as claimed in claim 4, further including a matching circuit, disposed between said second gate of said first field effect transistor and said radio frequency signal input terminal, for matching an input impedance of said second gate.

6. The mixer circuit as claimed in claim 5, further including a low-pass filter between said drain of said first field effect transistor and said intermediate frequency signal output terminal.

7. The mixer circuit as claimed in claim 6, further including a filter, disposed between said gate of said second field effect transistor and said local oscillation signal input terminal, for preventing the intermediate frequency signal mixed-down in said mixer circuit from leaking to an opposite side of said local oscillation signal input terminal.

8. A mixer circuit for mixing a radio frequency signal and a local oscillation signal to output an intermediate frequency signal comprising:

a radio frequency signal input terminal to be supplied with the radio frequency signal, a local oscillation signal input terminal to be supplied with the local oscillation signal, an intermediate frequency signal output terminal for outputting the intermediate frequency signal, a first field effect transistor with a pulse-doped structure, for mixing the radio frequency signal and the local oscillation signal from said input terminals to output the intermediate frequency signal, said first field effect transistor being a dual gate field effect transistor and having a first gate connected to said local oscillation signal input terminal a second gate, a drain connected to said intermediate frequency signal output terminal, and a source connected to a voltage potential, and a second field effect transistor with a pulse-doped structure, said second field effect transistor being a single gate field effect transistor and having a gate connected to said radio frequency input terminal, said gate of said second field effect transistor having a gate width shorter than said second gate of said first field effect transistor, a drain connected to said second gate of said first field effect transistor, and a source connected to said voltage potential.

9. The mixer circuit as claimed in claim 8, wherein said mixer circuit includes:

first bias means for supplying said first gate of said first field effect transistor with a gate bias voltage in the vicinity of a pinch-off voltage of said first gate;

second bias means for supplying said second gate of said first field effect transistor with a gate bias voltage in the vicinity of a pinch-off voltage of said second gate; and third bias means for supplying a gate of said second field effect transistor with a gate bias voltage such that a mutual conductance of said gate of said second field effect transistor is unvaried even when a gate input voltage of said gate of said second field effect transistor is varied.

10. The mixer circuit as claimed in claim 9, wherein said second field effect transistor is a GaAs-MESFET.

11. The mixer circuit as claimed in claim 10, further including a coupling capacitor disposed between said drain of said second field effect transistor and said second gate of said first field effect transistor.

12. The mixer circuit as claimed in claim 11, further including a matching circuit, disposed between said gate of said second field effect transistor and said radio frequency signal input terminal, for matching an input impedance of said gate of said second field effect transistor.

13. The mixer circuit as claimed in claim 12, further including a low-pass filter disposed between said drain of said first field effect transistor and said intermediate frequency signal output terminal.

14. The mixer circuit as claimed in claim 13, further including a filter, disposed between said first gate of said first field effect transistor and said local oscillation signal input terminal, for preventing the intermediate frequency signal mixed-down in said mixer circuit from leaking to an opposite side of said local oscillation signal input terminal.

15. A mixer circuit for mixing a radio frequency signal and a local oscillation signal to output an intermediate frequency signal comprising:

a radio frequency signal input terminal to be supplied with the radio frequency signal, a local oscillation signal input terminal to be supplied with the local oscillation signal, an intermediate frequency signal output terminal for outputting the intermediate frequency signal, a first field effect transistor with a pulse-doped structure, for mixing the radio frequency signal and the local oscillation signal from said input terminals to output the intermediate frequency signal, said first field effect transistor being a dual gate field effect transistor and having a first gate, a second gate, a drain connected to said intermediate frequency signal output terminal, and a source connected to a voltage potential, a second field effect transistor with a pulse-doped structure, said second field effect transistor being a single gate field effect transistor and having,
- a gate connected to said local oscillation signal input terminal, said gate of said second field effect transistor having a shorter gate width than said gate of said first field effect transistor,
- a drain connected to said first gate of said first field effect transistor, and
- a source connected to said voltage potential, and a third field effect transistor with a pulse-doped structure, said third effect transistor being a single gate field effect transistor and having,
- a gate connected to said radio frequency signal input terminal, said gate of said third field effect transistor having a shorter gate width than said gate of said first field effect transistor,
- a drain connected to said second gate of said first field effect transistor, and
- a source connected to said voltage potential.

16. The mixer circuit as claimed in claim 15, wherein said mixer circuit includes:
- first bias means for supplying said first gate of said first field effect transistor with a gate bias voltage in the vicinity of a pinch-off voltage of said first gate;
- second bias means for supplying said second gate of said first field effect transistor with a gate bias voltage in the vicinity of a pinch-off voltage of said second gate;
- third bias means for supplying said gate of said second field effect transistor with a gate bias voltage such that a mutual conductance of said gate of said second field effect transistor is unvaried even when a gate input voltage of said gate of said second field effect transistor is varied; and
- fourth bias means for supplying a gate of said third field effect transistor with a gate bias voltage such that a mutual conductance of said gate of said third field effect transistor is unvaried even when a gate input voltage of said gate of said third field effect transistor is varied.

17. The mixer circuit as claimed in claim 16, wherein each of said second field effect transistor and said third field effect transistor is a GaAs-MESFET having a pulse-doped structure.

18. The mixer circuit as claimed in claim 17, further including a first coupling capacitor disposed between said drain of said second field effect transistor and said first gate of said first field effect transistor, and a second coupling capacitor disposed between said drain of said third field effect transistor and said second gate of said first field effect transistor.

19. The mixer circuit as claimed in claim 18, further including a matching circuit, disposed between said gate of said third field effect transistor and said radio frequency signal input terminal, for performing an input impedance matching operation for said gate of said third field effect transistor.

20. The mixer circuit as claimed in claim 19, further including a low-pass filter disposed between said drain of said first field effect transistor and said intermediate frequency signal output terminal.

21. The mixer circuit as claimed in claim 20, further including a filter, disposed between said gate of said second field effect transistor and said local oscillation signal input terminal, for preventing the intermediate frequency signal mixed-down in said mixer circuit from leaking to an opposite side of said local oscillation signal input terminal.

* * * * *